United States Patent
Strane

(10) Patent No.: US 7,041,571 B2
(45) Date of Patent: May 9, 2006

(54) AIR GAP INTERCONNECT STRUCTURE AND METHOD OF MANUFACTURE

(75) Inventor: Jay W. Strane, Chester, NY (US)

(73) Assignee: International Business Machines Corporation, Armonk, NY (US)

( * ) Notice: Subject to any disclaimer, the term of this patent is extended or adjusted under 35 U.S.C. 154(b) by 151 days.

(21) Appl. No.: 10/708,408

(22) Filed: Mar. 1, 2004

(65) Prior Publication Data

US 2005/0191862 A1 Sep. 1, 2005

(51) Int. Cl.
*H01L 21/76* (2006.01)
(52) U.S. Cl. .......................... 438/411; 438/422; 438/619
(58) Field of Classification Search ................ 438/406, 438/409, 421, 422, 411, 456, 595, 619, 623, 438/780, 781, 778; 257/506, 510, 522, 704, 257/750, 752, 758, 759
See application file for complete search history.

(56) References Cited

U.S. PATENT DOCUMENTS

| | | | |
|---|---|---|---|
| 5,923,074 A | 7/1999 | Jeng | |
| 5,936,295 A * | 8/1999 | Havemann et al. | 257/522 |
| 6,261,942 B1 | 7/2001 | Zhou et al. | |
| 6,287,979 B1 * | 9/2001 | Zhou et al. | 438/723 |
| 6,316,347 B1 | 11/2001 | Chang et al. | |
| 6,380,106 B1 | 4/2002 | Lim et al. | |
| 6,479,366 B1 | 11/2002 | Miyamoto | |
| 6,498,070 B1 | 12/2002 | Chang et al. | |

* cited by examiner

*Primary Examiner*—Alexander Ghyka
*Assistant Examiner*—Kyoung Lee
(74) *Attorney, Agent, or Firm*—Howard M. Cohn; H. Daniel Schnurmann

(57) ABSTRACT

A dual layer of polymeric material is deposited with a base layer and top layer resist onto an integrated circuit structure with topography. The base layer planarizes the surface and fills in the native topography. The base layer decomposes almost completely when exposed to an oxidizing environment. The top layer contains a high composition of oxidizing elements and is photosensitive. (i.e., the layer can be patterned by exposing normal lithographic techniques.) The patterning allows the creation of escape paths for the decomposition products of the underlying base layer. This structure is decomposed in an oxidizing ambient (or plasma) leaving behind a thin carbon-containing membrane. This membrane layer blocks deposition of future layers, creating air gaps in the structure.

16 Claims, 4 Drawing Sheets

AIR GAP INTERCONNECT STRUCTURE AND METHOD OF MANUFACTURE

BACKGROUND OF INVENTION

The present invention relates generally to semiconductor device processing and, more particularly to interconnect structures having air gaps between adjacent conductive lines.

The evolution of integrated circuits toward higher complexity and decreased size has lead to closer spacing between the conducting wires (lines). Resulting capacitance increase produces time delays and creates cross-talk between the wiring elements. Current semiconductor fabrication techniques typically comprise many conductive wiring levels to complete the final working integrated circuits.

Semiconductor devices are typically joined together to form useful circuits using what is called "interconnect structures." These interconnect structures are typically made of conductors such as copper (Cu) or aluminum (Al) and dielectric materials such as silicon dioxide ($SiO_2$). The speed of these interconnects can be roughly assumed to be inversely proportional to the product of the line resistance (R), and the capacitance (C) between lines. To reduce the delay and increase the speed, it is desirable to reduce the capacitance (C). This can be done by reducing the dielectric constant (k), of the dielectric material due to the relationship $C=k\epsilon_0 A/d$, where $\epsilon_0$ is a universal constant, A is the coupling area, and d is the distance between two conductors. Decreasing the dielectric constant (k) leads to a direct decrease in capacitance (C). Conventional silicon dioxide has a dielectric constant (k) of approximately 4.1. A variety of "low-k" materials are known, such as SiLK™, an organic polymer with k=2.65 sold by Dow Chemical, and Black Diamond™, a organosilicon glass with k of 2.7 to 3.0, sold by Applied Materials.

RC (resistance-capacitance resonant) losses in the wiring levels of integrated circuits (ICs) make significant contributions limiting the final performance of the final semiconductor product. Therefore, the overall performance can be improved by reducing these RC losses. Using low-k materials such as SICOH, SILK are currently use as the dielectric between the metal line but air voids introduce ways to decrease these capacitance losses even further. Many techniques have been proposed to produce these structures—for example U.S. Pat. Nos. 6,316,347; 6,380,106; 6,498,070; and 5,923,074 often using the decomposition of polymeric layer to create these gaps.

Commonly-owned U.S. Pat. No. 6,472,740 discloses self-supporting air bridge interconnect structure for integrated circuits. A method for forming a multilevel interconnect structure for an integrated circuit is disclosed. In an exemplary embodiment of the invention, the method includes forming a starting structure upon a substrate, the starting structure having a number of metallic conducting lines contained therein. A disk is bonded to the top of said starting structure, the disk including a plurality of mesh openings contained therein. The mesh openings are then filled with an insulative material, thereby forming a cap upon the starting structure, wherein the cap may structurally support additional interconnect layers subsequently formed there atop.

U.S. Pat. No. 6,261,942 discloses dual metal-oxide layer as air bridge. A method for introducing air into the gaps between neighboring conducting structures in a microelectronics fabrication in order to reduce the capacitive coupling between them. A patterned metal layer is deposited on a substrate. The layer is lined with a CVD-oxide. A disposable gap-filling material is deposited over the lined metal layer. A two layer "air-bridge" is formed over the gap-fill by depositing a layer of TiN over a layer of CVD-oxide. This structure is rendered porous by several chemical processes. An oxygen plasma is passed through the porous air-bridge to react with and dissolve the gap-fill beneath it. The reaction products escape through the porous air-bridge resulting in air-filled gaps.

U.S. Pat. No. 6,316,347 discloses air gap semiconductor structure and method of manufacture. The method includes providing a substrate having metallic lines thereon. A high molecular weight sacrificial film is formed over the substrate. A portion of the high molecular weight sacrificial layer is removed to form spacers. A dielectric layer is formed over the substrate, the top surface of the metallic lines and the spacers. Finally, a thermal dissociation operation is conducted to remove the spacers, thereby forming an air pocket on each sidewall of the metallic lines.

U.S. Pat. No. 6,380,106 discloses method for fabricating an air gap metallization scheme that reduces inter-metal capacitances of interconnect structures. A method of manufacturing a metallization scheme with an air gap formed by vaporizing a filler polymer material is described. The filler material is covered by a critical permeable dielectric layer. The method begins by forming spaced conductive lines over a semiconductor structure. The spaced conductive lines have top surfaces. A filler material is formed over the spaced conductive lines and the semiconductor structure. The filler material is preferably comprised of a material selected from the group consisting of polypropylene glycol (PPG), polybutadine (PB) polyethylene glycol (PEG), fluorinated amorphous carbon and polycaprolactone diol (PCL) and is formed by a spin on process or a CVD process. The filler material is etched back to expose the top surfaces of the spaced conductive lines. Next, the semiconductor structure is loaded into a HDPCVD chamber. In a critical step, a permeable dielectric layer is formed over the filler material. The permeable dielectric layer has a property of allowing decomposed gas phase filler material to diffuse through. In another critical step, the filler material is vaporized, changing the filler material into a vapor phase filler material. The vapor phase filler material diffuses through the permeable dielectric layer to form a gap between the spaced conductive lines. An insulating layer is formed over the permeable dielectric layer.

U.S. Pat. No. 6,498,070 discloses air gap semiconductor structure and method of manufacture. The method includes forming a sacrificial polymer film over a substrate having metal lines thereon. A portion of the sacrificial polymer film is subsequently removed to form first spacers. A microporous structure layer is formed over the substrate and the metal lines and between the first spacers. A portion of the micro-porous structure layer is removed to form second spacers. The first spacers are removed by thermal dissociation to form air gaps. A dielectric layer is formed over the substrate and the metal lines and between the second spacers.

U.S. Pat. No. 5,923,074 discloses low capacitance interconnect structure for integrated circuits using decomposed polymers. A low capacitance interconnect structure and process is provided for integrating low-k decomposed polymers into integrated circuit structures and processes, especially those requiring multiple levels of interconnect lines, for reduced capacitance over prior art structures. Embodiments use polymers which typically decompose into gases with lower dielectric coefficients than the original polymer to provide a lower dielectric constant material between conductive interconnects on an integrated circuit. The materials are decomposed after being sealed in with a cap layer to prevent contamination of the gas filled void left after decomposition. The technique also combines the advantages of $SiO_2$ with low dielectric decomposed polymers by placing the low decomposed material only between tightly spaced lines. The low-k polymer material can be applied by spin-on techniques or by vapor deposition.

SUMMARY OF INVENTION

It is a general object of the invention to provide an improved technique for forming air gap bridges in semiconductor interconnect structures.

According to the invention, a method is provided for forming air gaps in a starting structure on a semiconductor substrate comprising:

depositing a first layer comprising a first material on the starting structure; depositing a second layer comprising a second material on the first layer;

patterning the second layer, resulting in gaps between portions of the second layer; and subjecting the substrate to a highly oxidizing environment so that the first material will substantially completely decompose into volatile products and the second material will partially decompose leaving a thin membrane layer.

The starting structure is suitably a wiring layer (interconnect structure) comprising conductive lines which may be disposed atop an underlying layer or disposed within a dielectric layer. The membrane seals off air gaps between adjacent conductive lines.

The present invention provides a method for creating low dielectric voids in semiconductor structures using a thin patterned membrane created by oxidation of a polymer layer containing oxidizing elements (e.g., Si). A dual layer of polymeric material is deposited with a base layer resist and top layer resist onto an integrated circuit structure with topography. The base layer planarizes the surface and fills in the native topography. The base layer decomposes almost completely when exposed to an oxidizing environment. The top layer contains a high composition of oxidizing elements and is photosensitive (i.e., the layer can be patterned by exposing normal lithographic techniques.). The patterning allows the creation of escape paths for the decomposition products of the underlying base resist. This structure is decomposed in an oxidizing ambient (or plasma) leaving behind a thin carbon-containing membrane. This membrane acts as a "lid" or "tabletop" (depending on the initial integrated circuit surface) which seals off the air gaps, preventing future dielectric depositions from filling in the air gaps.

The present invention advantageously combines a patterning process with a gap formation process where the air gaps can be patterned in the semiconductor structure. This technique allows the precise patterning of the air gaps and thereby allows easy tailoring of the RC improvements with mechanical stability of the structure. By combining the membrane layer with the patterning layer this also simplifies the process over deposition of a membrane followed by a separate patterning and etch.

The present invention differs from the techniques previously proposed in that is allows easy patterning to place air gap only in the desire areas and also to create vents for the escaping products of the decomposing base layer polymer, thereby, creating structures that can optimize thermal stability with capacitance reduction between the wiring lines.

The general idea of decomposing polymers to create air gaps has been previously proposed in a number of earlier patents, discussed hereinabove. These differ in structure and process with many focusing on the technique to allow the by-products from the decomposition of the polymer fill layer to escape—for example, through a permeable overlying layer (or mesh). In contrast thereto, the present invention utilizes lithographic patterning to create distinct escape paths for the byproducts of polymer fill decomposition. The membrane itself is relatively impermeable.

In one embodiment of the invention, a patternable bilayer resist is used so that the patterning and capping layer are combined into a single layer, and the decomposition and formation of the "tabletop" layer occur in the same thermal or plasma treatment. Bilayer resist technology where Si has been incorporated into the resist chemistries to improve etch resistance to $O_2$ containing chemistries. Thermal decomposition has been previously suggested to remove the sacrificial polymer layer, but the present invention can advantageously utilize lower temperature plasma decomposition.

An advantage of the present invention is that polymer gap fill can be removed simultaneously with (in the same step as) creating the capping layer. Another advantage is the ability to pattern the top layer using a photosensitive polymer.

BRIEF DESCRIPTION OF DRAWINGS

The structure, operation, and advantages of the present invention will become further apparent upon consideration of the following description taken in conjunction with the accompanying figures (FIGs.). The figures are intended to be illustrative, not limiting. Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

DETAILED DESCRIPTION

In the description that follows, numerous details are set forth in order to provide a thorough understanding of the present invention. It will be appreciated by those skilled in the art that variations of these specific details are possible while still achieving the results of the present invention. Well-known processing steps are generally not described in detail in order to avoid unnecessarily obfuscating the description of the present invention.

In the description that follows, exemplary dimensions are presented for an illustrative embodiment of the invention. The dimensions should not be interpreted as limiting. They are included to provide a sense of proportion. Generally speaking, it is the relationship between various elements, where they are located, their contrasting compositions, and sometimes their relative sizes that is of significance.

FIGS. 1–6 illustrate a first embodiment of the invention. FIGS. 7–11 illustrate a second embodiment of the invention. In the first embodiment, the invention is implemented in conjunction with a "mesa" type incoming (starting) structure having features atop a surface. In the second embodiment, the incoming structure is a "trough" type structure, having features extending into a surface. These two embodiments are shown separately but both embodiments could be implemented on a single integrated circuit (IC) chip.

Figure 1:
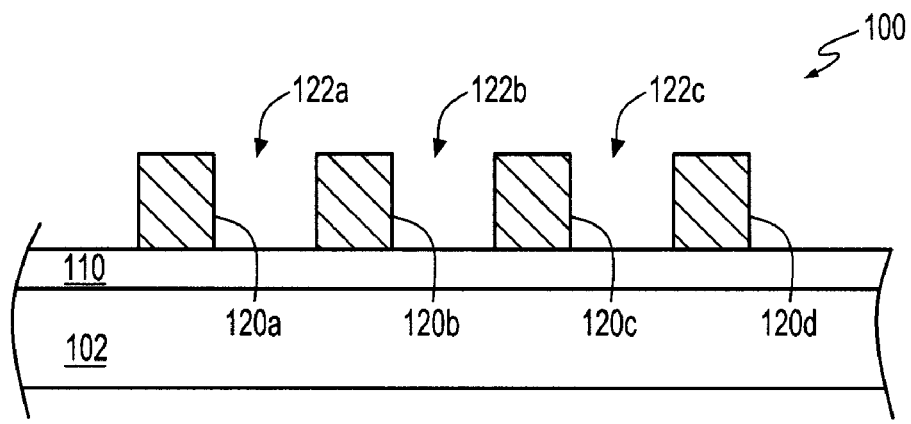
FIGS. 1–6 are side cross-sectional views of a sequence of steps, according to a first embodiment of the invention.

FIG. 1 shows an integrated circuit (IC) 100 comprising a substrate 102, a layer 110 atop the substrate, and a wiring level (collectively referred to as "120") comprising a plurality of conductive lines 120a, 120b, 120c and 120d disposed atop the layer 110. The layer (level) 110 can be diffusions, an underlying interconnect layer, an interlevel dielectric (ILD), etc. An underlying ILD 110 often comprises silicon oxide or low-k dielectric material. There are gaps (or voids) 122a, 122b, 122c (collectively generally referred to as "122") between adjacent ones of the conductive lines 120. This represents a typical incoming (starting) interconnect (wiring) structure (level) used in IC manufacturing.

The conductive lines 120 of the starting structure comprise a conducting material such as aluminum (Al), copper (Cu) or tungsten (W). This structure can be achieved a number of ways, such as (i) by deposition of a planar metal followed by a lithography process which patterns a masking layer then etching away the unpatterned material or (ii) by using a damascene process in create a metal pattern in the base dielectric, then etching the base dielectric away exposing the pattern metal.

In the past, the gaps 122 between the conductive lines were filled with a solid dielectric material, to support the construction of a subsequent wiring level. It is now considered to be desirable to "fill" these gaps 122 between the conductors with air or with a gas, rather than with a solid dielectric material, and then to cap them off, as discussed in commonly-owned U.S. Pat. No. 6,472,740 which discloses a self-supporting air bridge interconnect structure for integrated circuits.

Figure 2:
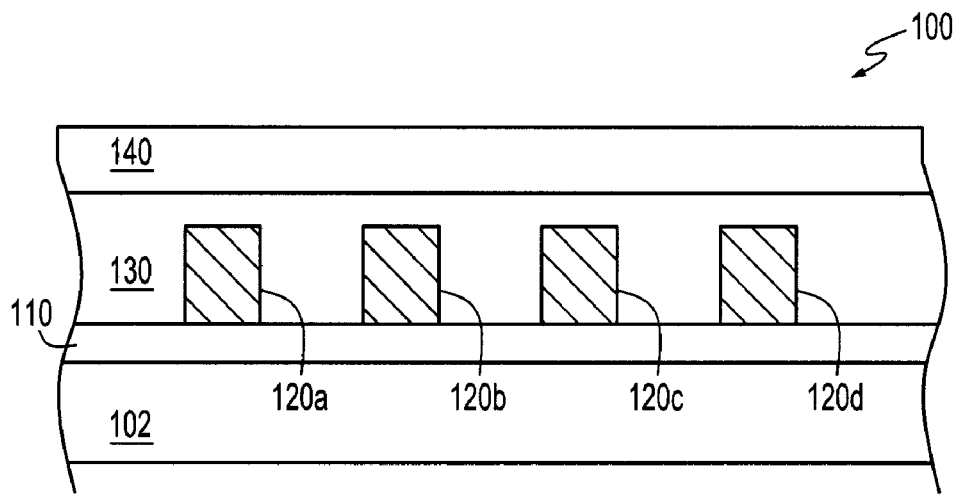

A dual layer of polymer based material, is deposited on the starting structure, as shown in FIG. 2. Typically, these materials would be deposited using spin on techniques.

The first, bottom (lower) layer 130 is a base resist material which can be easily decomposed at relatively low temperatures or in an oxygen plasma, and it does not have to be photosensitive. An example is a polymer based material. The first layer 130 can be a material selected from the group consisting of polypropylene glycol (PPG), polybutadine (PB) polyethylene glycol (PEG), fluorinated amorphous carbon and polycaprolactone diol (PCL). The first layer 130 fills the gaps 122 and covers the conductive lines 120. The first layer 130 is preferably substantially planar.

The second, top (upper) layer 140 also comprises a polymer based material which is easily decomposed at low temperatures or in an oxygen plasma, but it has a high content of an oxidizable component. An example is a resist containing a high composition of silicon (Si), or aluminum (Al) or any metal which forms a strong coherent oxide film upon oxidation. The layer 140 is photosensitive so it can be easily patterned by exposing to electromagnetic radiation, in a conventional manner (e.g., photolithography). The second layer 140 covers the first polymer layer 130. As discussed in greater detail hereinbelow, when the dual layer 130/140 is exposed to a highly oxidizing environment, the top layer 140 will partially decompose leaving a thin oxide layer (membrane 150, described below) behind, and the bottom layer 130 will substantially completely decompose into volatile products. In order to create a relatively flat membrane (150, described below), the top surface of the underlying layer 130 should be relatively flat.

The first layer 130 is shown extending between (in the gaps 122) and atop the conductive lines 120 of the starting structure. The height of the conductive lines would be dependent on the desired resistivity and aspect ration for eventual ILD fill. For example, the conductive lines 120 have a height up to 4 times the critical feature and a distance between adjacent conductive lines (e.g., between 120a and 120b) could be as small as ½ (one-half) the minimum feature size. The minimum feature size is decreasing with each generation of semiconductor. In 1988, 0.5 micron was cutting edge minimum pitch size while in 2003 it was reduced to nearly 0.1 micron. This invention has been demonstrated on 0.11 technology with trenches that were 200 nm deep where the resist thickness were on the order of 800 nm for the first layer and 150 nm for the second. The limitation on the thickness of the first layer would be its ability to planarize the underlying topography and the ability to control the membrane's location during the decomposition/oxidation that also creates the membrane described below.

Figure 3:
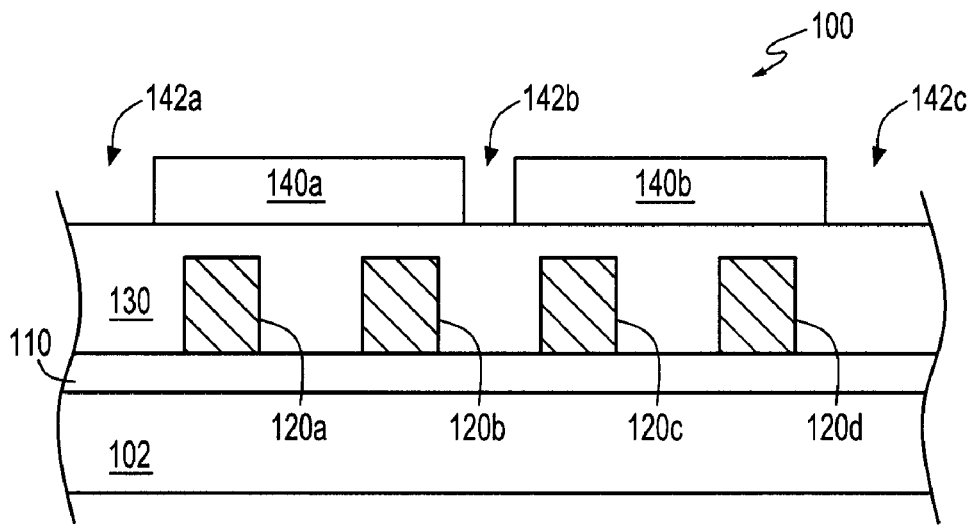

The next step is to pattern the top polymer layer 140 using a conventional photolithography process, as illustrated in FIG. 3, selectively removing portions of the top layer 140 and leaving behind other portions of the top layer 140— designated 140a and 140b in this figure. The portions 140a and 140b of the top layer are generally coplanar with each other and parallel to the surface of the substrate 102, and they are laterally spaced apart from one another atop the underlying first polymer layer 130. There is a gap 142a to the left (as viewed) of the portion 140a, a gap 142b between the portions 142a and 142b, and a gap 142c to the right (as viewed) of the portion 140b. Areas on the surface of the underlying polymer layer 130 are exposed by these gaps 142a, 142b and 142c (collectively referred to as "142")—in other words, they are no longer covered by portions of the overlying polymer layer 140. This step creates escape paths (the gaps 142) for subsequent volatile decomposition products and also to remove portions of the top layer 140 from regions where the residual oxidation product (150, described below) from its decomposition is not desired.

Note that the membrane portion 140a is disposed over the conductive lines 120a and 120b, spanning the filled gap (122a) therebetween. The gap 142b is disposed above the filled gap (122b) between the conductive lines 120b and 120c. The membrane portion 140b is disposed over the conductive lines 120c and 120d, spanning the filled gap (122c) therebetween.

Figure 4:
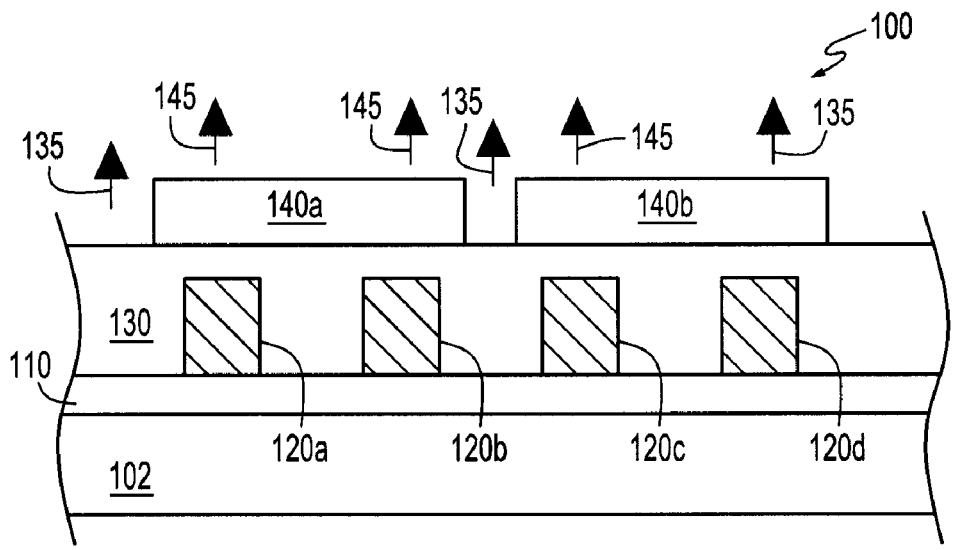
Figure 5:
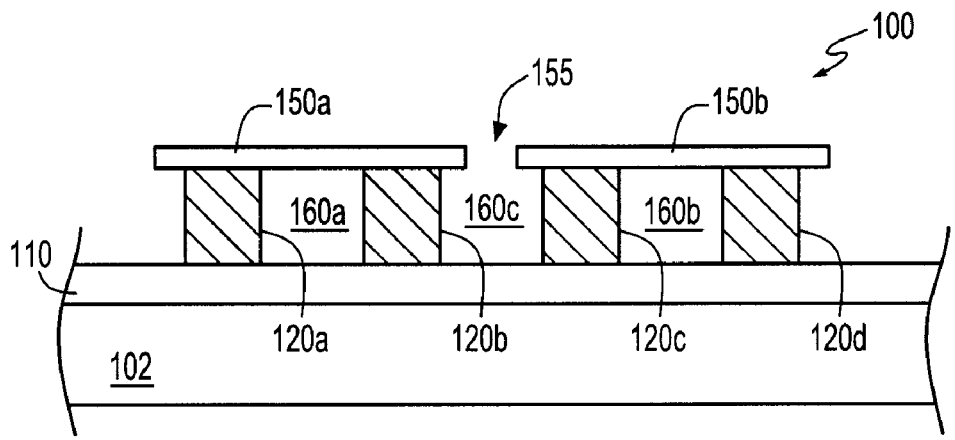

Next, the structure is exposed to an oxidizing ambient which initiates the decomposition of the polymeric materials 130 and 140, as shown in FIG. 4. This can be done using a high temperature process with a oxidizing ambient (for example, above 250° C.), or using a plasma of oxidizing gases. During this treatment the lower layer 130 will decompose substantially completely into volatile products (indicated by arrows 135) and the top layer 140a, 140b will also decompose giving off volatile products (indicated by arrows 145). After oxidizing, a thin skin (or membrane) is left behind, as shown in FIG. 5. This thin membrane is composed of a oxide containing a significant amount of carbon. For the example of a silicon (Si) containing initial resist, the film will be a silicon-oxycarbonate. The membrane (collectively referred to as "150") comprises remnants 150a, 150b of the top polymer layer 140.

The membrane 150 will have a thickness that is dependent upon the initial thickness of the top resist 140, the amount of the oxidizing element in the resist and the processing conditions. In order to have sufficient structural integrity (rigidity) to undergo future process it normally needs to be greater than of approximately 20–30 nm, and is rigid enough to create a capping layer on the underlying topography as shown in FIG. 5, preferably capable of supporting a subsequent wiring level (not shown). The membrane 150 is oxide in nature and thereby relatively rigid.

Air gaps 160a, 160b and 160c (collectively referred to as "160") are created between adjacent ones of the conductive lines 120. Selected ones of the air gaps are sealed off by the portions of the membrane 150 capping the topography—for example, the membrane portion 150a covers and seals (closes off) the air gap 160a between conductive lines 120a and 120b, the membrane portion 150b closes off the air gap 160b between conductive lines 120c and 120d. There are also "venting" holes 155 in the membrane 150, such as between adjacent membrane portions 150a and 150b) where the volatiles products can be vented. (The venting hole 155 is shown over a gap 160c between conductive lines 120b and 120c.) Without periodic venting holes the film would be destroyed by the pressure of the underlying decomposition products.

The materials of the two layers 130 and 140 are similar in that they both decompose in the same oxidizing environment, and are different in the decomposition products. The base layer 130 decomposes completely into volatile products whereas the top layer 140 has nonvolatile products which coalesce to form the thin mostly oxide membrane. For example, the top layer 140 would contain resin, a photoactive agent, and an organic compound containing the desired amount of the oxidizing element; and the bottom layer 130 would merely be the resin, and thus not patterned in the lithographic process.

For an example of 248 nm lithography where polyhydroxystyrene based resists can be implemented. The top layer would have 10–12% Si (for this case) and the photoacid generator (PAG) whereas the base layer could be also based on polyhydroxystyrene but would be devoid of the PAG and Si. By using this bilayer resist formulation the bottom layer acts as an antireflective coating (ARC) and the planarization of the bottom layer would improve lithography conditions. For lithography implementation the top layer usually is thin (>200 nm) whereas the bottom layer is thicker (400–1000 nm), however, depending on the desired requirements of the mesa/tabletop pattern the top layer could be tailored for membrane properties such as rigidity.

The oxidation and decomposition of the bilayer to form the suspended membrane pattern could be achieved at relatively low temperature (T>200° C.) and in a plasma environment the conversion could be achieved with room temperature chuck temperatures.

Figure 6:
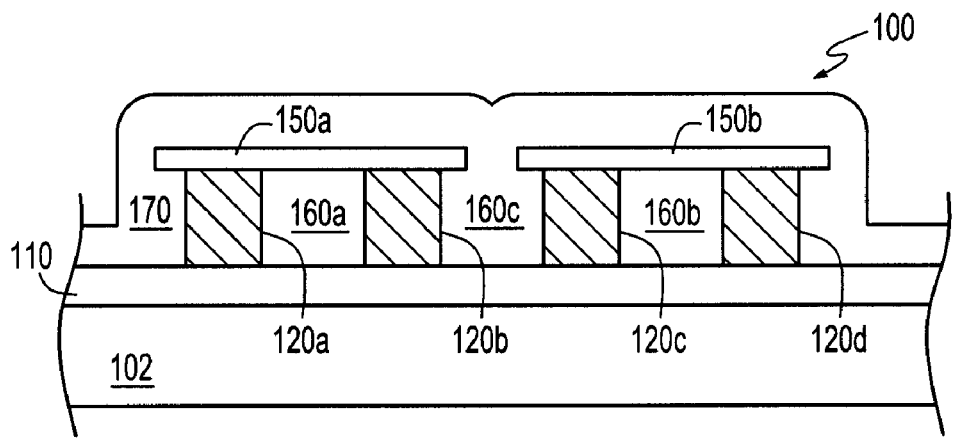

Finally, as shown in FIG. 6, an interlevel dielectric (ILD) 170 is deposited on the surface. This layer 170 can be oxide or other lower K dielectric materials to separate the existing wiring level from a next layer of wiring (not shown). During this deposition process, the venting holes 155 will be pinched off thereby completely covering and sealing the air gaps 162 below. The deposition conditions of this ILD film 170 can be optimized such that a little dielectric is deposited in the air gap 162 through the venting hole 155 before the deposition layer 170 closes the holes. This ILD layer 170 may serve as the beginning (or completion) of the dielectric layer the next wiring level (not shown, compare 110 which may be a previous ILD). The gaps 160a and 160b are prevented from being filled by ILD 170 since they are covered by membrane portions 150a and 150b. The gap 160c, which is not capped off, can be at least partially filled by ILD 170, but is preferably not filled by ILD 170 which preferably simply seals the gap 160c.

In summary, a starting structure has conductive lines 120 separated by gaps 122 which are not filled with anything (FIG. 1). The gaps are then filled with a first polymer 130 and the first polymer 130 is covered by a second polymer 140 (FIG. 2). The second polymer is patterned. (FIG. 3). The two polymers are decomposed—the first polymer substantially completely, the second polymer only partially (FIG. 4). Remnants 150 of the second polymer form a membrane which covers the conductive lines, and some of the gaps 160 are covered/sealed. (FIG. 5). An interlevel dielectric 170 is disposed atop the resulting structure, which seals any gaps which were not covered. (FIG. 6).

FIGS. 7–11 illustrate an alternate embodiment whereas the incoming structure has a topography with troughs extending into rather than features (conductive lines) disposed atop the surface of the substrate.

Figure 7:
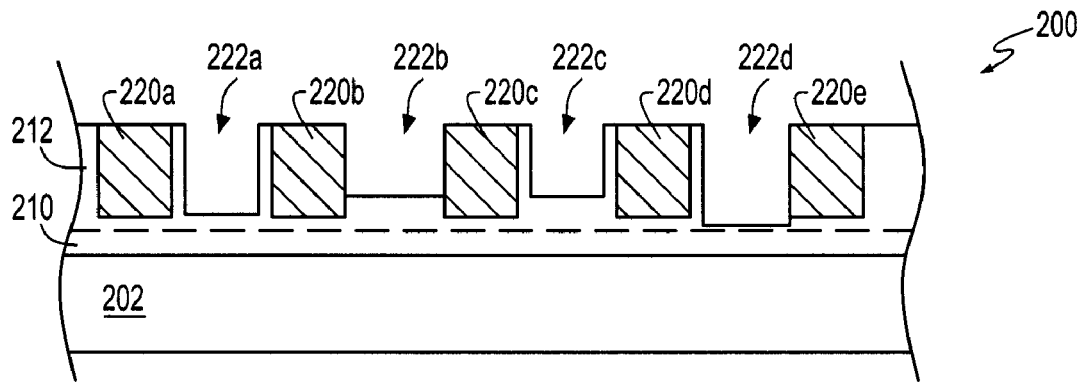
FIGS. 7–11 are side cross-sectional views of a sequence of steps, according to a second embodiment of the invention.
Figure 8:
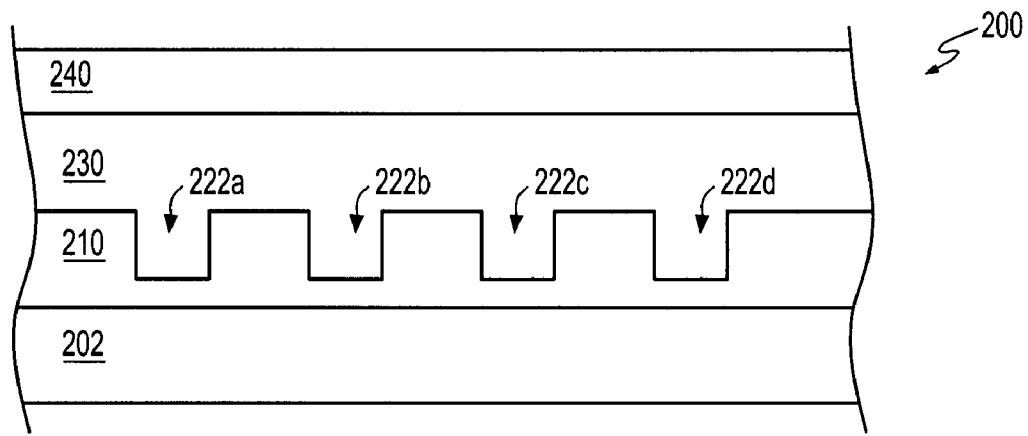
Figure 9:
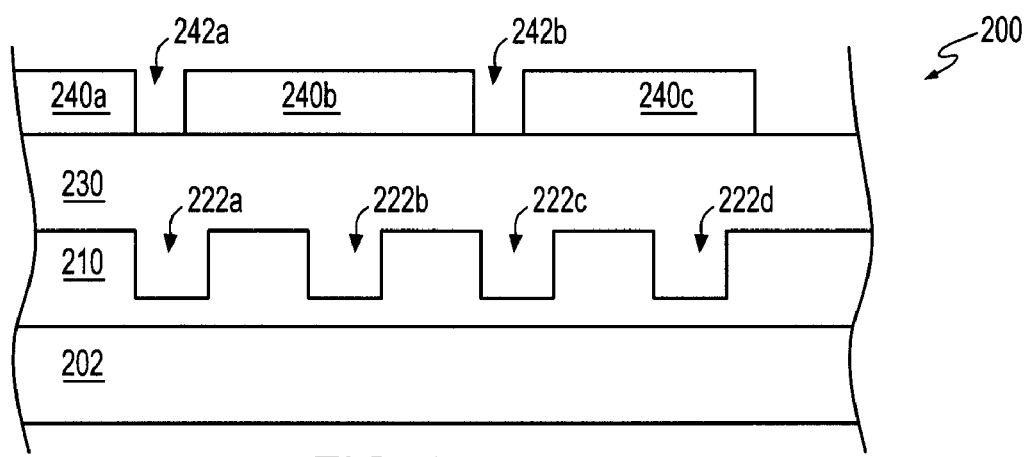
Figure 10:
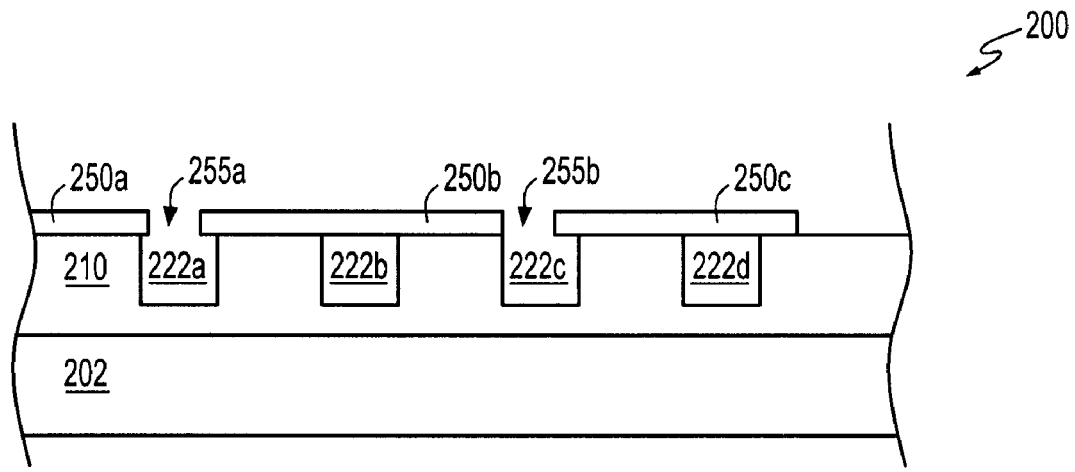
Figure 11:
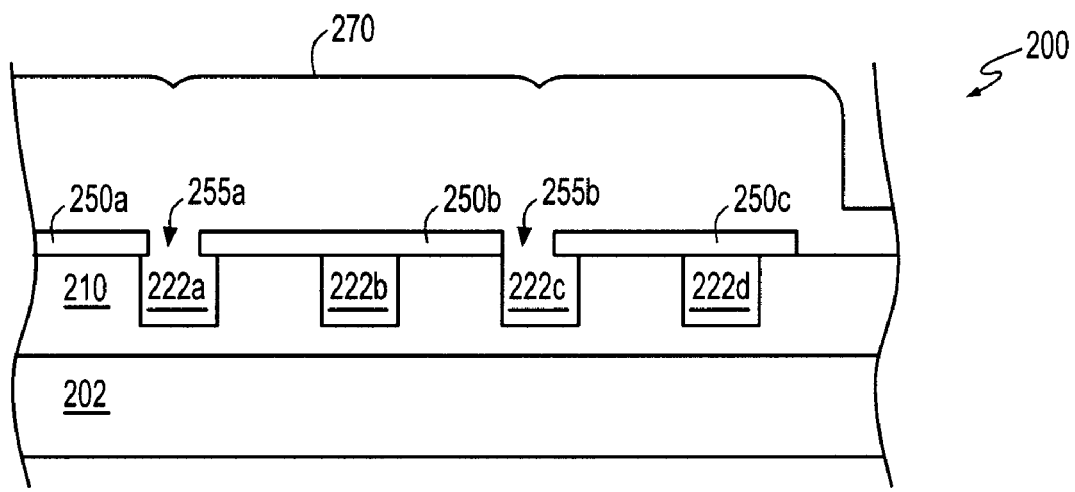

FIG. 7 shows an integrated circuit (IC) 200 comprising a substrate 202, and a layer 210 atop the substrate. A wiring layer 212 atop the layer 210 comprises dielectric material, and conductive lines 220a, 220b, 220c, 220d, 220e (collectively referred to as "220") extending into (embedded in) the dielectric material. This is typical of a damascene process. The underlying layer (level) 210 can be diffusions, an underlying interconnect layer, an interlevel dielectric (ILD), etc. In the case of ILD, the underlying layer 210 often comprises silicon oxide or low-k dielectric material, and can be integral with the dielectric material of the wiring layer 212. (For this reason, the interface between 210 and 212 is shown as a dotted line, rather than as a solid line, in FIG. 7. In FIGS. 8–11, 210 and 212 are shown as a single element 210.) Rather than gaps (or voids), there is dielectric material between adjacent ones of the conductive lines 220. This represents a typical incoming (starting) interconnect (wiring) structure (level) used in IC manufacturing.

In this embodiment, troughs 222a, 222b, 222c, 222d (collectively referred to as "222") are etched, using any suitable process, into the surface of the dielectric material of the wiring layer. These troughs could be formed by patterning and etching the surface of the layer 212.

The conductive lines 220 typically all have substantially the same height—e.g., approximately 500–1000 nm. The troughs 222 may extend into the layer 212 as deep as the conductive lines 220, not as deep as the conductive lines 220, or deeper than the conductive lines 220.

In this example, the trough 222a is disposed between the conductive lines 220a and 220b, and extends to a depth substantially equal to the height of the conductive lines 220. Also, the trough 222a is shown as being not as wide as the gap between the two conductive lines 220a and 220b. Hence, there is dielectric material 212 on the trough-facing sides of the conductive lines 220a and 220b.

The trough 222b is disposed between the conductive lines 220b and 220c, and is shallower than the height of the conductive lines 220. Also, the trough 222b is shown as being as wide as the gap between the two conductive lines 220b and 220c. Hence, there is no dielectric material 212 on the trough-facing sides of the conductive lines 220b and 220c.

The trough 222c is disposed between the conductive lines 220c and 220d, but is not as wide as the gap between the two conductive lines 220c and 220d. Hence, there is dielectric material 212 on the trough-facing sides of the conductive lines 220c and 220d.

The trough 222d is disposed between the conductive lines 220d and 220e, and is shown as being deeper than the height of the conductive lines 220, as well as extending to a side surface of the conductive line 220e. In this case, using a wet etch (for example), the exposed side surface of the conductive line 220e could be undercut (not shown), which may (in some circumstances) be desirable.

Different size and shape troughs 222 are shown in FIG. 7 simply to illustrate the concept that the starting structure has troughs in a surface of a layer which is a wiring layer. In FIGS. 8–11, the troughs 222 are shown having a single, uniform depth, and the conductive lines 220 are omitted, for illustrative clarity. The layers 210 and 212 are shown as a single ILD layer 210.

Although the starting structure is different, the process of forming air gaps is essentially the same in FIGS. 8–11 as it was in FIGS. 2–6. (FIG. 8 corresponding to FIG. 2, FIG. 9 corresponding to FIGS. 3–4, FIG. 10 corresponding to FIG. 5, and FIG. 11 corresponding top FIG. 6).

The troughs 222 are filled with a first polymer 230 (compare 130) and the first polymer 230 is covered by a second polymer 240 (compare 140). The first polymer 230 also covers the top surfaces of the conductive lines 220. See FIG. 8.

The second polymer 240 is patterned, leaving portions 240a, 240b, 240c (compare 140a, 140b, 140c) separated by gaps 242a, 242b (compare 142a, 142b). See FIG. 9.

The two polymers are decomposed—the first polymer substantially completely, the second polymer only partially. Remnants 250a, 250b, 250c (compare 150a, 150b) of the second polymer form a membrane 250 (compare 150) which covers the surface of the ILD 210. Some of the troughs (222b, 222d) are covered/sealed, while others (222a, 222c) are not covered by membrane 250. See FIG. 10.

Selected troughs (compare air gaps 160) are sealed off by the portions of the membrane 250 capping the topography—for example, the membrane portion 250b covers and seals (closes off) the trough 222b between conductive lines 220b and 220c. There are also "venting" holes in the membrane 250, such as a venting hole 255a over the trough 222a, and a venting hole 255b over the trough 222c, where the volatiles products can be vented. Also, portions of the dielectric layer 210 can remain exposed (not covered by material 240 or membrane 250.

An interlevel dielectric 270 (compare 170) is disposed atop the resulting structure, which seals any troughs which were not covered. See FIG. 11. Again patterning techniques are used to create escape vents for the decomposition products.

The invention has been illustrated and described in a manner that should be considered as exemplary rather than restrictive in character it being understood that all changes and modifications that come within the scope of the invention as set forth in the claims. For example, rather than creating air gaps in a wiring layer, air gaps can be created in a dielectric layer. For example, imagine FIG. 8 (without the conductive lines, which were omitted from the view). In this manner, both dielectric constant and thermal properties can be controlled locally, using conventional processes. For example, in a manner similar to that described in the aforementioned U.S. Pat. No. 6,472,740, the gaps 160 may be filled with a gas such as $N_2$, Ar, Xe, He, Kr or $SF_6$.

The invention claimed is:

1. A method of forming air gaps in a starting structure on a semiconductor substrate comprising:
    depositing a first layer comprising a first material on the starting structure;
    depositing a second layer comprising a second material on the first layer;
    patterning the second layer, resulting in gaps between portions of the second layer; and
    subjecting the substrate to a highly oxidizing environment so that the first material will substantially completely decompose into volatile products and the second material will partially decompose leaving a thin membrane layer.
2. A method, according to claim 1, wherein:
the first layer is deposited by a spin-on process.
3. A method, according to claim 1, wherein:
the second layer is deposited by a spin-on process.
4. A method, according to claim 1, wherein:
the first material comprises comprises a polymer based material which is easily decomposed at low temperatures or in an oxygen plasma.
5. A method, according to claim 1, wherein:
the second material comprises comprises a polymer based material which is easily decomposed at low temperatures or in an oxygen plasma, and has a high content of an oxidizable component.
6. A method, according to claim 1, wherein:
the second material comprises a resist containing a high composition of silicon (Si), or aluminum (Al) or any metal which forms a strong coherent oxide film upon oxidation.
7. A method, according to claim 1, wherein:
the thin membrane comprises an oxide containing a significant amount of carbon.
8. A method, according to claim 1, wherein:
the second material is photosensitive, and is patterned using photolithography.
9. A method, according to claim 1, wherein:
the starting structure is a wiring layer comprising conductive lines.
10. A method, according to claim 9, wherein:
when the second layer is patterned, selected portions of the second layer are disposed over selected adjacent ones of the conductive lines of the starting structure.
11. A method, according to claim 9, wherein:
air gaps between adjacent conductive lines are sealed off by portions of the thin membrane layer.
12. A method, according to claim 9, wherein:
the conductive lines are disposed atop an underlying layer; and
there are gaps between adjacent conductive lines; and
the first material fills the gaps and covers the conductive lines.
13. A method, according to claim 12, wherein:
when the second layer is patterned, selected ones of the gaps of the second layer are disposed over selected ones of gaps between adjacent ones of the conductive lines of the starting structure.
14. A method, according to claim 9, wherein:
the conductive lines are disposed within a dielectric layer; there are troughs between adjacent conductive lines; and
the first material fills the troughs and covers the conductive lines.
15. A method, according to claim 14, wherein:
when the second layer is patterned, selected ones of the gaps of the second layer are disposed over selected ones of the troughs between adjacent ones of the conductive lines of the starting structure.
16. A method, according to claim 1, further comprising:
depositing an interlevel dielectric (ILD) on the surface of the substrate.

* * * * *